US012684800B2

(12) United States Patent
Cheng

(10) Patent No.: US 12,684,800 B2
(45) Date of Patent: Jul. 14, 2026

(54) ENHANCEMENT-MODE SWITCHING DEVICE AND PREPARATION METHOD THEREFOR

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 489 days.

(21) Appl. No.: 18/318,608

(22) Filed: May 16, 2023

(65) Prior Publication Data

US 2023/0387283 A1      Nov. 30, 2023

(30) Foreign Application Priority Data

May 31, 2022      (CN) .......................... 202210611236.3

(51) Int. Cl.
*H10D 30/47*          (2025.01)
*H10D 30/01*          (2025.01)
*H10D 62/85*          (2025.01)
*H10D 64/01*          (2025.01)
*H10D 64/27*          (2025.01)

(52) U.S. Cl.
CPC ......... *H10D 30/475* (2025.01); *H10D 30/015* (2025.01); *H10D 62/8503* (2025.01); *H10D 64/01* (2025.01); *H10D 64/411* (2025.01)

(58) Field of Classification Search
CPC ............... H10D 30/475; H10D 30/015; H10D 62/8503; H10D 64/01; H10D 64/411; H10D 30/4732; H10D 64/256; H10D 62/343; H10D 62/117; H10D 62/149; H10D 62/10; H01L 29/0692; H01L 29/1029; H01L 29/20; H01L 29/0603; H01L 29/7786; H01L 29/4236
See application file for complete search history.

(56) References Cited

U.S. PATENT DOCUMENTS

| 9,419,121 | B1 * | 8/2016 | Teo | ...................... | H10D 30/472 |
| 2005/0110042 | A1 * | 5/2005 | Saito | .................... | H10D 30/801 |
| | | | | | 257/E29.119 |
| 2007/0096077 | A1 * | 5/2007 | Sanga | .................. | H10H 20/816 |
| | | | | | 257/E33.033 |

(Continued)

*Primary Examiner* — William B Partridge
*Assistant Examiner* — David Paul Sedorook
(74) *Attorney, Agent, or Firm* — Westbridge IP LLC

(57) ABSTRACT

Disclosed are an enhancement-mode switching device and a preparation method therefor. The enhancement-mode switching device includes: a substrate; a channel structure; an n-type semiconductor layer covering a bottom wall of the trench; a p-type semiconductor layer arranged in a gate region; a gate electrode arranged on a side, away from the substrate, of the p-type semiconductor layer; a source electrode arranged in a source region; a drain electrode arranged in a drain region. In the gate region, the p-type semiconductor layer and n-type semiconductor layer are in contact with each other to form a space depletion region in the gate region, and the electronic channel between the source electrode and the drain electrode of the switching device is interrupted, so that the switching device may be effectively turned off under a gate bias voltage of zero, improving control capability of the gate electrode and reliability of the device.

16 Claims, 8 Drawing Sheets

(56)                    References Cited

U.S. PATENT DOCUMENTS

| | | | |
|---|---|---|---|
| 2012/0235209 A1* | 9/2012 | Briere | H02M 7/106 |
| | | | 257/E27.061 |
| 2015/0372126 A1* | 12/2015 | Bunin | H10D 30/477 |
| | | | 257/194 |
| 2017/0345921 A1* | 11/2017 | Feng | H10D 64/513 |
| 2019/0267454 A1* | 8/2019 | Matioli | H10D 30/4732 |
| 2021/0050437 A1* | 2/2021 | Cheng | H01L 23/3171 |

* cited by examiner

ENHANCEMENT-MODE SWITCHING DEVICE AND PREPARATION METHOD THEREFOR

CROSS-REFERENCE TO RELATED APPLICATIONS

This disclosure claims priority to Chinese Patent Application No. 202210611236.3, filed on May 31, 2022, which is hereby incorporated by reference in its entirety.

TECHNICAL FIELD

The disclosure relates to the technical field of semiconductors, in particular, to an enhancement-mode switching device and a preparation method therefor.

BACKGROUND

Gallium nitride (GaN) material has stable chemical properties, high temperature resistance, and corrosion resistance, and has inherent advantages in high-frequency, high-power, and radiation-resistant applications. High electron mobility transistors (HEMTs) based on aluminum gallium nitride (AlGaN)/gallium nitride (GaN) heterojunctions have been widely used in the semiconductor field.

SUMMARY

A purpose of the present disclosure is to provide an enhancement-mode switching device and a preparation method therefor to improve a control ability of a gate electrode of a switching device.

According to an aspect of the present disclosure, an enhancement-mode switching device is provided, including:

a substrate;

a channel structure including a channel layer and a barrier layer, wherein the channel layer is arranged on the substrate, and the barrier layer is arranged on a side, away from the substrate, of the channel layer; a trench is provided on a side, away from the substrate, of the channel structure, and the trench penetrates through the channel structure; the channel structure includes a source region, a drain region, and a gate region located between the source region and the drain region; and the trench is arranged in the gate region;

an n-type semiconductor layer covering a bottom wall of the trench;

a p-type semiconductor layer, wherein the p-type semiconductor layer is arranged, in the gate region, on the n-type semiconductor layer, and at least a partial area of the p-type semiconductor layer is arranged in the trench;

a gate electrode arranged on a side, away from the substrate, of the p-type semiconductor layer;

a source electrode arranged in the source region; and a drain electrode arranged in the drain region.

As an optional embodiment, the n-type semiconductor layer covers the bottom wall and sidewalls of the trench, and the p-type semiconductor layer is arranged on the n-type semiconductor layer.

As an optional embodiment, the channel structure is a multi-channel structure including k layers of the channel layers and k layers of the barrier layers alternately arranged, where k≥2.

As an optional embodiment, a material of the n-type semiconductor layer includes one or more of n-type GaN, n-type AlGaN and n-type InGaN.

As an optional embodiment, a doping concentration of p-type impurity ions in the p-type semiconductor layer changes, from bottom to top, in one or more modes and the modes include: gradually increasing, gradually decreasing, step-type increasing, step-type decreasing and periodic changing.

As an optional embodiment, a material of the p-type semiconductor layer includes one or more of p-type GaN, p-type AlGaN and p-type InGaN.

As an optional embodiment, the p-type semiconductor layer includes at least one composition changing element, a content of the composition changing element changes in an epitaxial direction, and a changing curve of the content of the composition changing element in the epitaxial direction comprises one or more changing stages and the changing stages include: periodic changing, progressive increasing and progressive decreasing.

As an optional embodiment, the p-type semiconductor layer is a periodic structure, and the periodic structure includes at least one period stacked sequentially in the epitaxial direction, each period comprises a first periodic layer and a second periodic layer stacked sequentially in the epitaxial direction;

in the epitaxial direction, a content, in the first periodic layer, of the composition changing element increases at an uniform speed and a content, in the second periodic layer, of a composition changing element decreases at an uniform speed in the epitaxial direction; or in the epitaxial direction, the content, in the first periodic layer, of the composition changing element decreases at an uniform speed and the content, in the second periodic layer, of the composition changing element increases at an uniform speed in the epitaxial direction; or in the epitaxial direction, a first content, in the first periodic layer, of the composition change element is constant, and a second content, in the second periodic layer, of the composition change element is constant, the first content is higher than the second content, or the first content is lower than the second content; or in the epitaxial direction, the content, in the first periodic layer, of the composition changing element increases at an uniform speed, and the content, in the second periodic, of the composition changing element is constant in the epitaxial direction; or in the epitaxial direction, the content, in the first periodic layer, of the composition changing element decreases at an uniform speed, and the content, in the second periodic layer, of the composition changing element is constant in the epitaxial direction.

As an optional embodiment, the trench includes a plurality of discrete trenches.

As an optional embodiment, the enhancement-mode switching device further includes:

a back barrier layer, arranged on one side, facing toward the substrate, of the channel layer.

As an optional embodiment, the back barrier layer is an n-type semiconductor layer.

As an optional embodiment, the enhancement-mode switching device further includes a cap layer arranged on a side, away from the substrate, of the barrier layer, and the cap layer is provided with an opening communicating with the trench.

3

As an optional embodiment, the enhancement-mode switching device further includes an N-type heavily doped nitride semiconductor arranged in the source region and the drain region.

According to another aspect of the disclosure, an enhancement-mode switching device is provided, including:

a substrate;

a channel structure including a channel layer and a barrier layer, where the channel layer is arranged on the substrate, and the barrier layer is arranged on a side, away from the substrate, of the channel layer; a trench is provided on a side, away from the substrate, of the channel structure, and the trench penetrates through the channel structure; the channel structure includes a source region, a drain region, and a gate region located between the source region and the drain region; and the trench is arranged in the gate region;

an n-type semiconductor layer arranged on a surface, facing toward the substrate, of the channel layer, where the p-type semiconductor layer is formed on the n-type semiconductor layer exposed by the trench;

a gate electrode, arranged on a side, away from the substrate, of the p-type semiconductor layer;

a source electrode, arranged in the source region; and a drain electrode, arranged in the drain region.

According to another aspect of the disclosure, a preparation method for an enhancement-mode switch is provided, including:

providing a substrate;

forming a channel structure, where the channel structure includes a channel layer and a barrier layer, the channel layer is arranged on the substrate, and the barrier layer is arranged on one side, away from the substrate, of the channel layer; and the channel structure includes a source region, a drain region, and a gate region located between the source region and the drain region;

arranging a trench on a side, away from the substrate, of the channel structure, where the trench penetrates through the channel structure, and the trench is arranged in the gate region;

forming an n-type semiconductor layer covering a bottom wall of the trench;

forming a p-type semiconductor layer on the n-type semiconductor layer, where at least a partial area of the p-type semiconductor layer is arranged in the trench;

forming a gate electrode on one side, away from the substrate, of the p-type semiconductor layer;

forming a source electrode in the source region; and forming a drain electrode in the drain region.

As an optional embodiment, according to the preparation method for an enhancement-mode switching device, the forming an n-type semiconductor layer covering a bottom wall of the trench includes:

forming the n-type semiconductor layer covering the bottom wall and sidewalls of the trench.

As an optional embodiment, according to the preparation method for an enhancement-mode switching device, the forming a channel structure includes: forming a multi-channel structure including k layers of channel layers and k layers of barrier layers alternately arranged, where k≥2.

As an optional embodiment, the preparation method for an enhancement-mode switching device further includes: forming a back barrier layer on a side, facing toward the substrate, of the channel layer.

According to one aspect of the disclosure, a preparation method for an enhancement-mode switching device is provided, including:

4 providing a substrate;

forming an n-type semiconductor layer on the substrate;

forming a channel structure on the n-type semiconductor layer, where the channel structure includes a channel layer and a barrier layer, the channel layer is arranged on the substrate, the barrier layer is arranged on a side, away from the substrate, of the channel layer; and the channel structure includes a source region, a drain region, and a gate region located between the source region and the drain region;

arranging a trench on a side, away from the substrate, of the channel structure, where the trench penetrates through the channel structure; and the trench is arranged in the gate region;

forming a p-type semiconductor layer on the n-type semiconductor layer exposed by the trench, where at least a partial area of the p-type semiconductor layer is arranged in the trench;

forming a gate electrode on a side, away from the substrate, of the p-type semiconductor layer;

forming a source electrode in the source region; and forming a drain electrode in the drain region.

The enhancement-mode switching device of the present disclosure includes: a substrate, a channel structure, a source electrode, a drain electrode and a gate electrode; a trench penetrating through the channel structure; an n-type semiconductor layer covering a bottom wall of the trench; a p-type semiconductor layer arranged, in a gate region, on the n-type semiconductor layer, and at least a partial area of the p-type semiconductor layer is arranged in the trench.

DETAILED DESCRIPTIONS OF THE EMBODIMENTS

Exemplary embodiments will be described in detail with examples shown in accompanying drawings. When the following description refers to the accompanying drawings, the same numerals in different drawings refer to the same or similar elements unless otherwise indicated. Embodiments described in the following exemplary embodiments do not represent all embodiments consistent with the present disclosure. On the contrary, they are merely some examples of devices described in claims, which are consistent with some aspects of the present disclosure.

In order to realize an enhancement-mode HEMT, P-type gate technology is usually used. In order to enhance the control of the gate electrode on two-dimensional electron gas, it is necessary to reduce a distance between the P-type gate and the two-dimensional electron gas. In fact, electron capture centers exist in materials of channel layer and barrier layer and various interfaces, which makes a hot electron capture process of a device very significant when the device is working under a high voltage and high current, and a related current collapse effect and dynamic resistance characteristic degradation are very serious. How to solve the current collapse effect and improve a control ability of the gate electrode has become an urgent problem to be solved.

Figure 1:
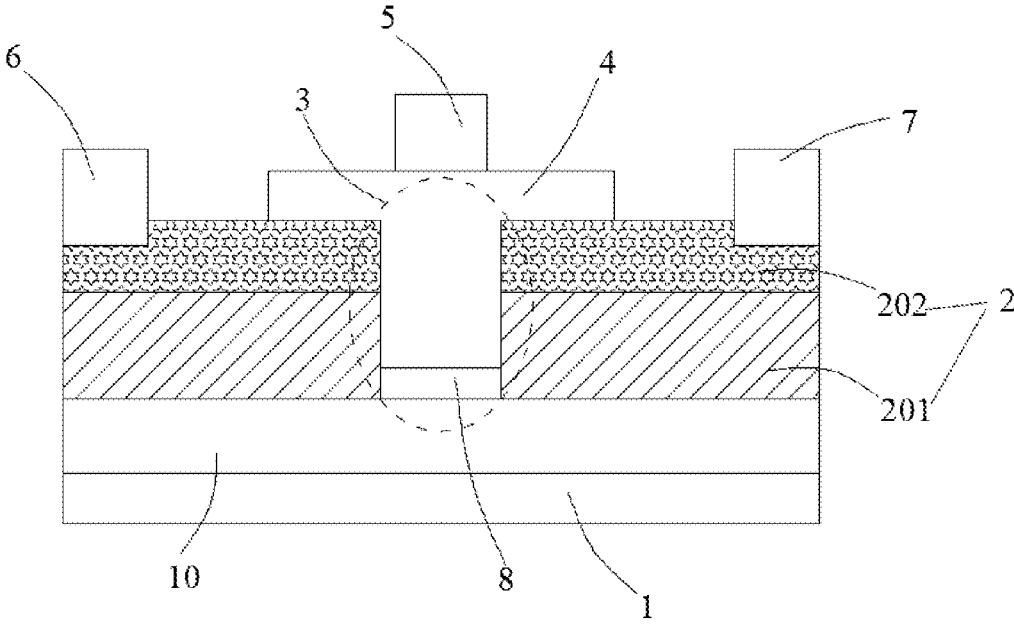
FIG. 1 is a schematic diagram of an enhancement-mode switching device according to an embodiment of the present disclosure.

An embodiment of the present disclosure provides an enhancement-mode switching device and a preparation method of the enhancement-mode switching device. FIG. 1 is a schematic diagram of an enhancement-mode switching device according to a embodiment of the present disclosure. The enhancement-mode switching device includes a substrate 1, a channel structure 2, an n-type semiconductor layer 8, a p-type semiconductor layer 4, a gate electrode 5, a source electrode 6 and a drain electrode 7.

Therein, the channel structure 2 includes a channel layer 201 and a barrier layer 202. The channel layer 201 is arranged on the substrate 1, the barrier layer 202 is arranged on a side, away from the substrate 1, of the channel layer 201; a trench 3 is provided on a side, away from the substrate 1, of the channel structure 2, and the trench 3 penetrates through the channel structure 2, namely the trench 3 penetrates through the barrier layer 202 and the channel layer 201; the channel structure 2 includes a source region, a drain region and a gate region located between the source region and the drain region; the trench 3 is arranged in the gate region; the n-type semiconductor layer 8 covers a bottom wall of the trench 3; the p-type semiconductor layer 4 is arranged, in the gate region, on the n-type semiconductor layer 8, and at least a partial area of the p-type semiconductor layer 4 is arranged in the trench 3; the gate electrode 5 is arranged on a side, away from the substrate 1, of the p-type semiconductor layer 4; the source electrode 6 is arranged in the source region; and the drain electrode 7 is arranged in the drain region.

As shown in FIG. 1, according to the present disclosure, the channel structure 2 under the n-type semiconductor layer

8 of the enhancement-mode switching device is completely penetrated, so that a space depletion region is formed in the gate region as the p-type semiconductor layer and the n-type semiconductor layer are in contact with each other in the gate region, and then an electronic channel between the source electrode 6 and the drain electrode 7 of the enhancement-mode switching device is interrupted, therefore the enhancement-mode switching device may be effectively turned off under a gate bias voltage of zero. When the gate electrode 5 of the enhancement-mode switching device is applied a positive bias voltage, a PN junction is formed as the p-type semiconductor layer and the n-type semiconductor layer are in contact with each other in the gate region, which may effectively suppress a current collapse effect of a device, improve dynamic characteristics, and improves a control capability of the gate electrode and reliability and robustness of the device. The enhancement-mode switching device of the disclosure may improve reliability of the gate electrode of the device, and has better avalanche, short circuit and surge capabilities.

In the following, each part of the enhancement-mode switching device shown in FIG. 1 is described in detail.

The substrate 1 may be a silicon substrate or a silicon carbide substrate, and a material of the substrate 1 is not limited thereto and may also be a sapphire substrate or the like. In addition, the enhancement-mode switching device of the present disclosure may also include a nucleation layer and a buffer layer 10 sequentially arranged on the substrate 1.

The channel structure 2 includes the channel layer 201 and the barrier layer 202. A forbidden band width of the barrier layer 202 is greater than a forbidden band width of the channel layer 201. The channel layer 201 may be arranged on a side, away from the substrate 1, of the buffer layer 10, and the barrier layer 202 may be arranged on the surface, facing away from the substrate 1, of the channel layer 201. A heterojunction structure may be formed by a combination of the channel layer 201 and the barrier layer 202. For example, taking a GaN-based material as an example, a material of the channel layer 201 may be GaN, a material of the barrier layer 202 may be AlGaN, and a two-dimensional electron gas (2DEG) may be obtained through a heterojunction structure formed by the channel layer 201 and the barrier layer 202. The channel layer 201 and the barrier layer 202 may also be made of other materials, such as GaAs-based materials, where the material of the channel layer 201 may be GaAS, and the material of the barrier layer 202 may be AlGaAS. The barrier layer 202 can be an n-type semiconductor, but the present disclosure makes no special limitation on this.

Figure 2:
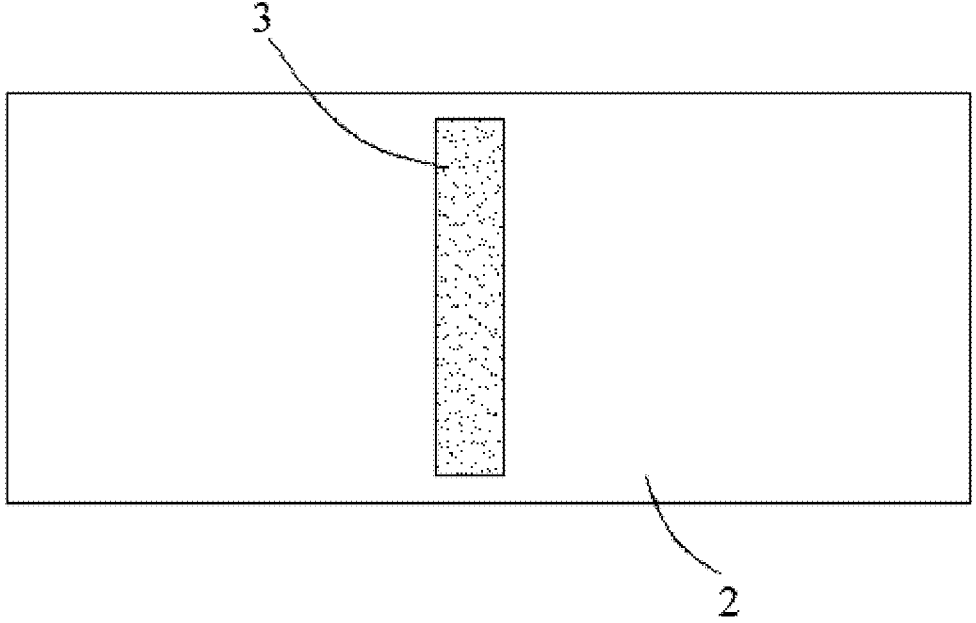
FIG. 2 is a top view of a trench in an enhancement-mode switching device according to an embodiment of the present disclosure.
Figure 3:
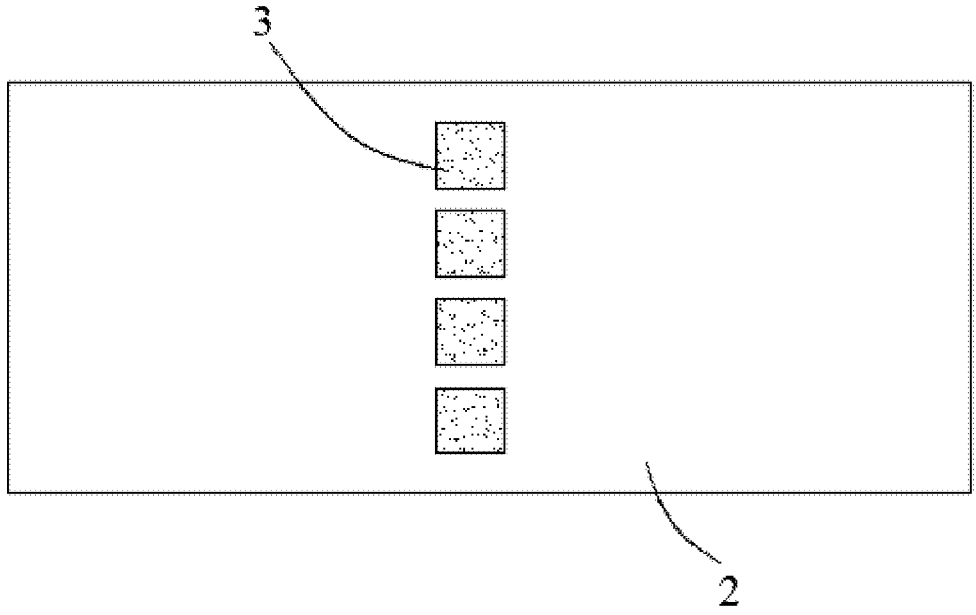
FIG. 3 is another top view of the trench in the enhancement-mode switching device according to an embodiment of the present disclosure.

The channel structure 2 includes the source region, the drain region and the gate region located between the source region and the drain region. The source region, the drain region and the gate region may all be strip-shaped and arranged parallel to each other, but the present disclosure makes no special limitation thereto. The trench 3 is arranged on one side of the channel structure 2 facing away from the substrate 1. The trench 3 penetrates through the barrier layer 202 and the channel layer 201, that is, a sum of a thickness of the barrier layer 202 and a thickness of the channel layer 201 is equal to a depth of the trench 3. The trench 3 may be a strip-type trench, as shown in FIG. 2; optionally, as shown in FIG. 3, the trench 3 may include a plurality of discrete trenches. However, this is not specifically limited in embodiments of the present disclosure. For example, the gate region where the gate electrode 5 is located is strip-shaped and the trench 3 is a strip-type trench, an extension direction of the trench 3 is the same as an extension direction of the gate region where the gate electrode 5 is located, and an orthographic projection of the trench 3 on substrate 1 is arranged in an orthographic projection region of the gate region where the gate electrode 5 is located on the substrate 1.

A material of the n-type semiconductor layer 8 may include one or more of n-type GaN, n-type AlGaN and n-type InGaN. It should be noted that the n-type semiconductor layer 8 may be formed by epitaxial growth before formation of the p-type semiconductor layer 4.

The p-type semiconductor layer 4 is arranged in the gate region, that is, an orthographic projection of the p-type semiconductor layer 4 on the substrate 1 may be located in an orthographic projection area of the gate region on the substrate 1. At least a partial area of the p-type semiconductor layer 4 is arranged in the trench 3, for example, a part of area of the p-type semiconductor layer 4 is arranged in trench 3, that is, the p-type semiconductor layer 4 does not protrude out of the trench 3; for another example, an entire area of the p-type semiconductor layer 4 is arranged within the trench 3, that is, the p-type semiconductor layer 4 protrudes outside the trench 3.

Figure 13:
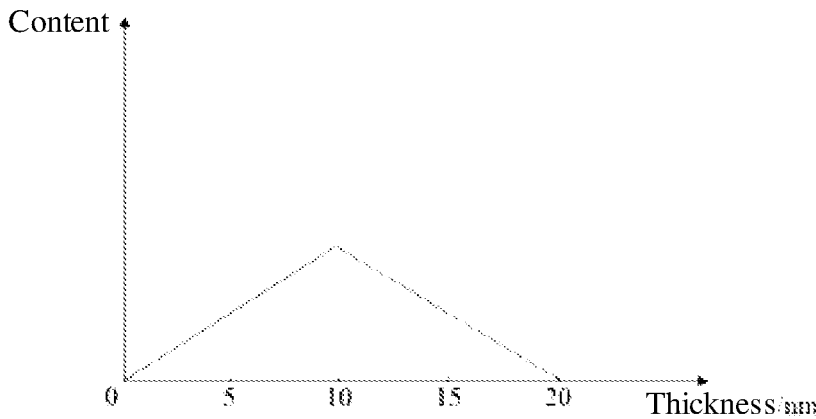
FIG. 13 (*a*)-FIG. 13 (*c*) are the changing curve of the composition changing element in the p-type semiconductor in an embodiment of the present disclosure.
Figure 13:
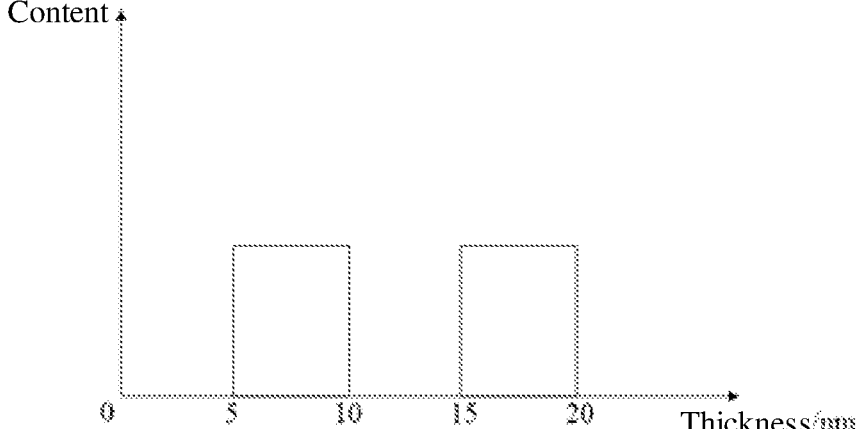
Figure 13:
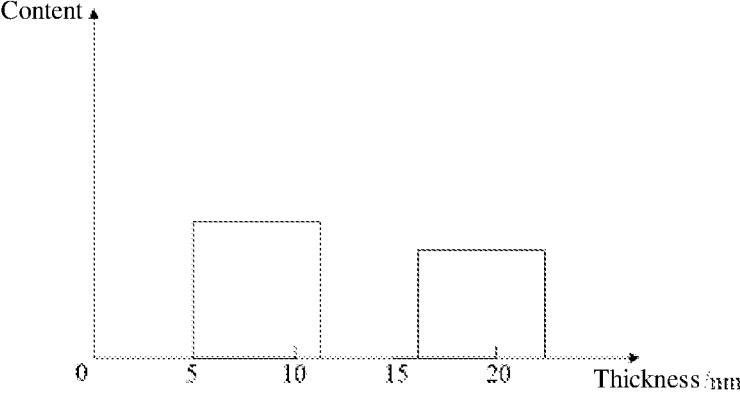

A material of the p-type semiconductor layer 4 may include one or more of p-type GaN, p-type AlGaN and p-type InGaN. In addition, a doping concentration of p-type impurity ions in the p-type semiconductor layer 4 changes, and a bottom-up changing pattern of doping concentration of p-type impurity ions include one or more of the following changing patterns: gradually increasing, gradually decreasing, step-type increasing, step-type decreasing and periodic changing. The p-type semiconductor layer 4 includes at least one composition changing element, and the composition changing element may be an Al element or an In element. A content of the composition changing element changes in an epitaxial direction, and a changing curve of the content of the composition changing element in the epitaxial direction includes one or more of the following changing stages: periodic changing, progressive increase, and progressive decrease, as shown in FIG. 13 (*a*)-FIG. 13 (*c*). Furthermore, the p-type semiconductor layer 4 may be a periodic structure, and the periodic structure includes at least one period sequentially stacked in the epitaxial direction, where each period includes a first periodic layer and a second periodic layer sequentially stacked in the epitaxial direction. The content of the composition changing element, in the first periodic layer, increases at an uniform speed, and decreases, in the second periodic layer, at an uniform speed; or the content of the composition changing element decreases, in the first periodic layer, at an uniform speed, and increases, in the second periodic layer, at an uniform speed; or a first content of the composition changing element in the first periodic layer is constant, and a second content in the second periodic layer is constant, where the first content is higher or lower than the second content; or the content of the composition changing element increases, in the first periodic layer, at an uniform speed, and the content in the second periodic layer is constant; or the content of the composition changing element decreases, in the first periodic layer, at an uniform speed, and the content in the second periodic layer is constant. In addition, a thickness of the first periodic layer may be greater than or equal to a thickness of the second periodic layer.

The gate electrode 5 is arranged on a side, away from the substrate 1, of the p-type semiconductor layer 4. The source electrode 6 is arranged in the source region. The drain electrode 7 is arranged in the drain region. Both the source electrode 6 and the drain electrode 7 contact with the heterojunction structure to form an ohmic contact. The materials of the gate electrode 5, the source electrode 6 and the drain electrode 7 may be metal, such as Ti/Al/Ni/Au, Ni/Au and so on.

Figure 14:
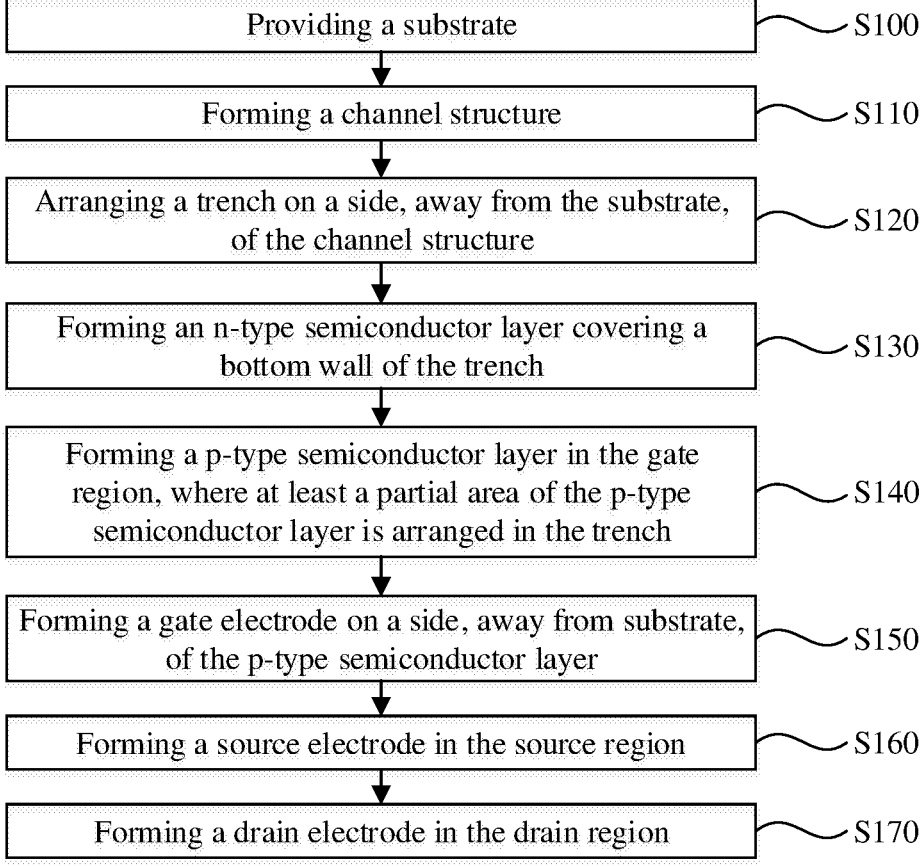
FIG. 14 is a flowchart of a preparation method for an enhancement-mode switching device according to an embodiment of the present disclosure.

A preparation method for an enhancement-mode switching device is used to manufacture the enhancement-mode switching device described above, as shown in FIG. 14, which may specifically include Step S100-Step S170:

Step S100, providing a substrate;

Step S110, forming a channel structure, where the channel structure includes a channel layer and a barrier layer, the channel layer is arranged on the substrate, the barrier layer is arranged on a side, away from the substrate, of the channel layer, and the channel structure includes a source region and a drain region and a gate region located between the source region and the drain region;

Step S120, arranging a trench on a side, away from the substrate, of the channel structure, where the trench penetrates through the channel structure and is arranged in the gate region;

Step S130, forming an n-type semiconductor layer covering a bottom wall of the trench;

Step S140, forming a p-type semiconductor layer in the gate region, where at least a partial area of the p-type semiconductor layer is arranged in the trench;

Step S150, forming a gate electrode on a side, away from substrate, of the p-type semiconductor layer;

Step S160, forming a source electrode in the source region;

Step S170, forming a drain electrode in the drain region.

In Step S110, the channel layer 201 and the barrier layer 202 may be prepared by epitaxial growth. In Step S120, the trench 3 may be formed by etching. In Step S140, the p-type semiconductor layer 4 may be prepared by epitaxial growth. In Step S150, Step S160 and Step S170, the gate electrode 5, the source electrode 6 and drain electrode 7 are formed by physical vapor deposition or chemical vapor deposition.

Figure 4:
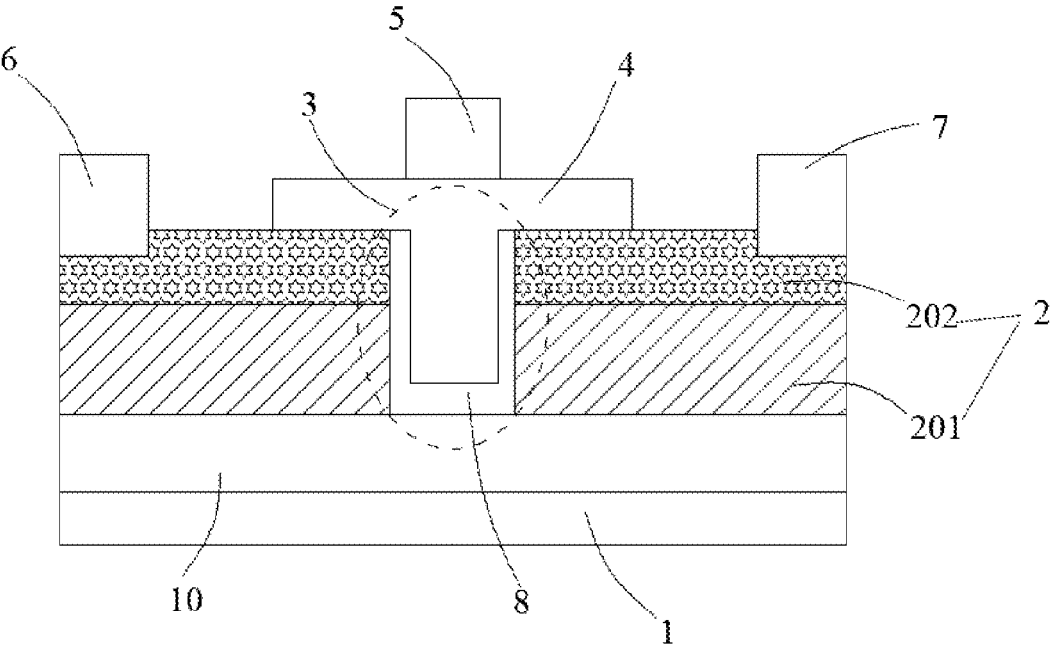
FIG. 4 is a schematic diagram of an enhancement-mode switching device according to an embodiment of the present disclosure.

FIG. 4 is a schematic diagram of an enhancement-mode switching device according to an embodiment of the present disclosure. The enhancement-mode switching device shown in FIG. 4 and a preparation method of the enhancement-mode switching device are roughly the same as the enhancement-mode switching device shown in FIG. 1 and the preparation method of the enhancement-mode switching device described above. An n-type semiconductor layer 8 covers a bottom wall and sidewalls of the trench 3, and a p-type semiconductor layer 4 is arranged on the n-type semiconductor layer 8. A material of the n-type semiconductor layer 8 may be n-type doped AlGaN, or one or more of n-type doped GaN and n-type InGaN. It should be noted that the n-type semiconductor layer 8 may be formed by epitaxial growth before formation of the p-type semiconductor layer 4. The n-type semiconductor layer 8 covering the bottom wall and the sidewalls of the trench is connected to the channel structure 2 interrupted by the trench, so that mobility will be significantly better than channel mobility in the MOSFET, thereby significantly reducing on-resistance of the device when the switching device is working.

Figure 5:
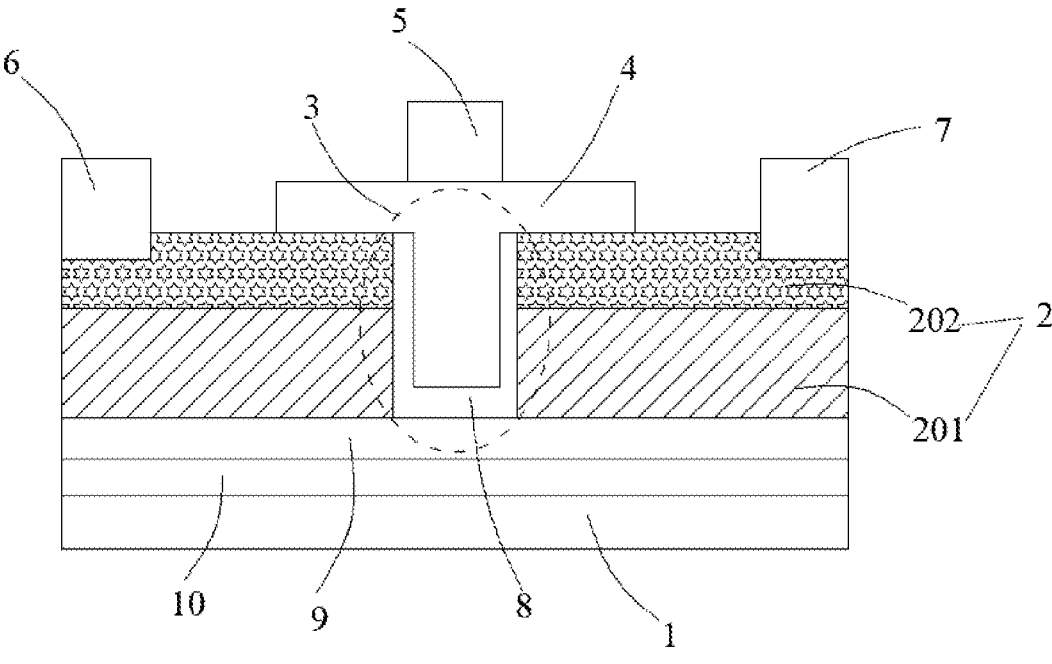
FIG. 5 is a schematic diagram of an enhancement-mode switching device according to an embodiment of the present disclosure.

FIG. 5 is a schematic diagram of an enhancement-mode switching device according to an embodiment of the present disclosure. The enhancement-mode switching device shown in FIG. 5 and the preparation method of the enhancement-mode switching device are roughly the same as the enhancement-mode switching device and preparation method of the enhancement-mode switching device of any embodiment shown in FIG. 1 and FIG. 4. A difference is that the enhancement-mode switching device further includes a back barrier layer 9. The back barrier layer 9 may be arranged on a side, facing toward the substrate 1, of the channel layer 201. A material of the back barrier layer 9 may include at least one of GaN, AlGaN, InGaN, and AlInGaN. The back barrier layer 9 is an n-type semiconductor, which may reduce on-resistance of the switching device when the switching device is working. The n-type back barrier layer 9 may be used as an etching stop layer when the trench 3 is etched, which further simplifies a preparation process of the switching device.

Figure 6:
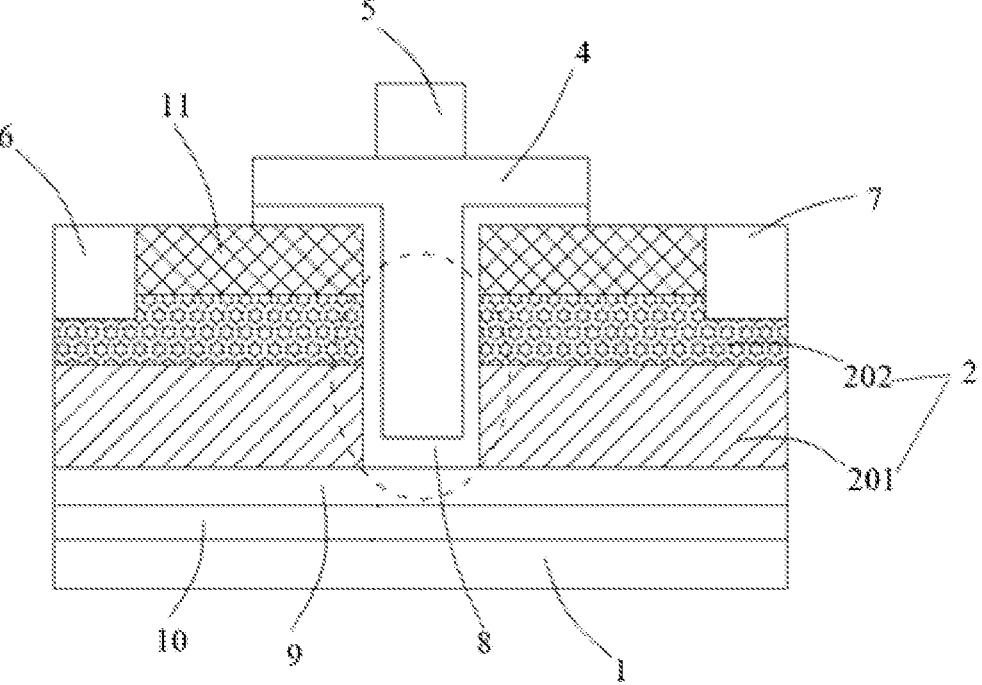
FIG. 6 is a schematic diagram of an enhancement-mode switching device according to an embodiment of the present disclosure.

FIG. 6 is a schematic diagram of an enhancement-mode switching device according to an embodiment of the present disclosure. The enhancement-mode switching device shown in FIG. 6 and the preparation method of the enhancement-mode switching device are roughly the same as the enhancement-mode switching device shown in FIG. 1 and the preparation method of the enhancement-mode switching device described above. A difference is that the enhancement-mode switching device further includes a cap layer 11. The cap layer 11 is arranged on a side, away from the substrate 1, of the barrier layer 202, the cap layer 11 is provided with an opening communicating with the trench 3. In addition, for example, the enhancement-mode switching device includes an n-type semiconductor layer 8 arranged on a bottom wall andof the trench 3, and the n-type semiconductor layer 8 may cover a surface, away from the substrate 1, of the cap layer 11.

Figure 7:
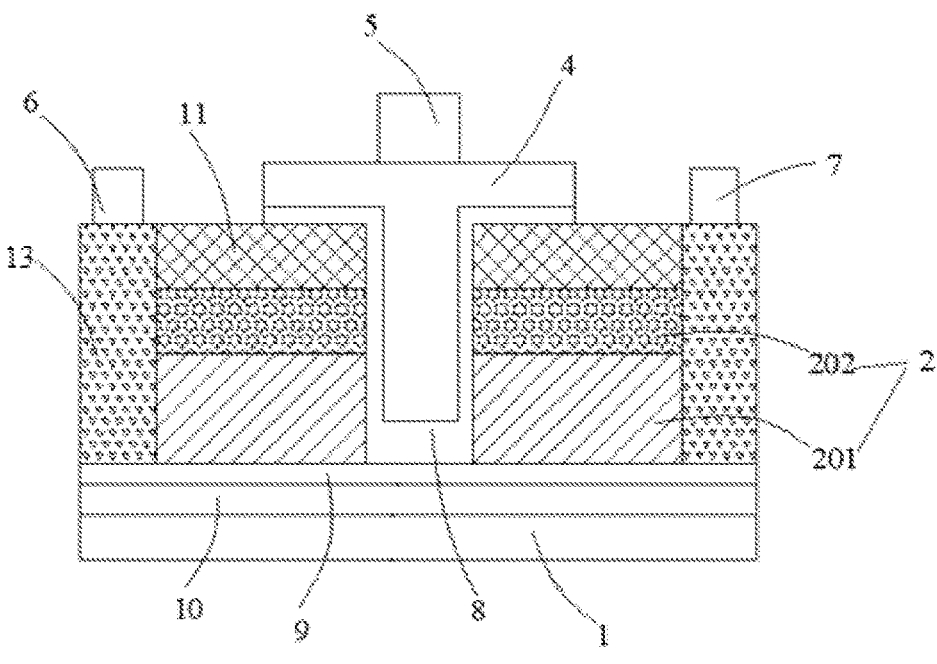
FIG. 7 is a schematic diagram of an enhancement-mode switching device according to an embodiment of the present disclosure.

FIG. 7 is a schematic diagram of an enhancement-mode switching device according to an embodiment of the present disclosure. The enhancement-mode switching device shown in FIG. 7 and the preparation method of the enhancement-mode switching device are roughly the same as the enhancement-mode switching device and the preparation method of the enhancement-mode switching device of any embodiment shown in FIG. 1, FIG. 4, FIG. 5 and FIG. 6. A difference is that the enhancement-mode switching device further includes an N-type heavily doped nitride semiconductor 13, the N-type heavily doped nitride semiconductor 13 is arranged in the source region and the drain region. In correspondence to the source region, the N-type heavily doped nitride semiconductor 13 is arranged between on the source electrode 6 and channel structure 2; in correspondence to the drain region, the N-type heavily doped nitride semiconductor 13 is arranged between the drain electrode 7 and the channel structure 2. The N-type heavily doped nitride semiconductor 13 covers sidewalls of the channel structure 2, further reducing contact resistance between the source electrode 6 and the channel structure 2 and contact resistance between the drain electrode 7 and the channel structure 2.

Figure 8:
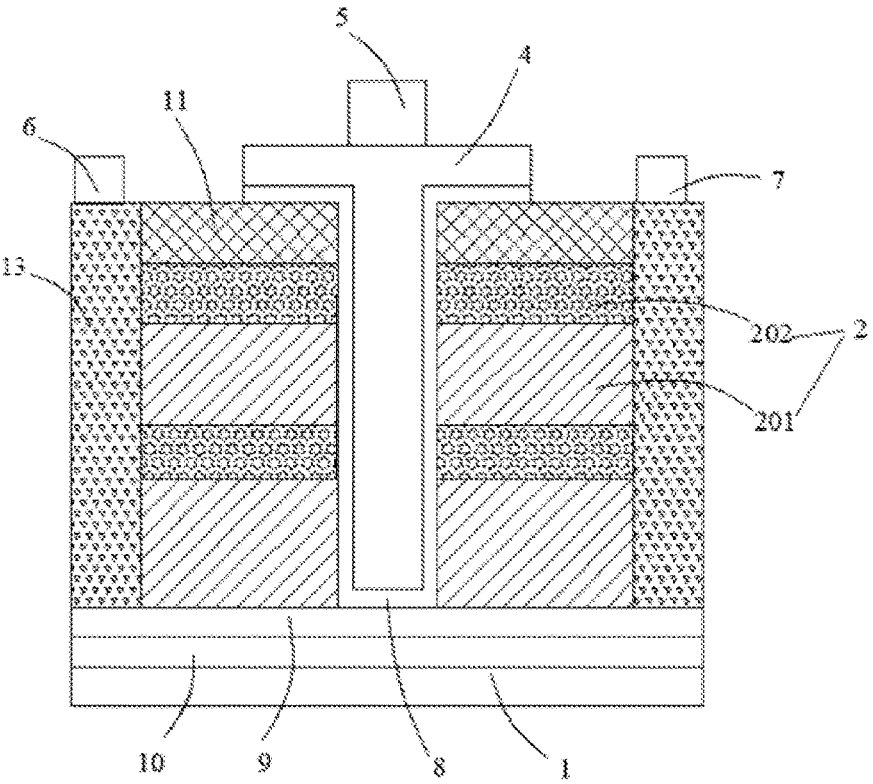
FIG. 8 is a schematic diagram of an enhancement-mode switching device according to an embodiment of the present disclosure.

FIG. 8 is a schematic diagram of an enhancement-mode switching device according to an embodiment of the present disclosure. The enhancement-mode switching device shown in FIG. 8 and the preparation method of the enhancement-mode switching device are roughly the same as the enhancement-mode switching device and the preparation method of the enhancement-mode switching device of any embodiment shown in FIG. 1, FIG. 4, FIG. 5, FIG. 6 and FIG. 7. A difference is that the channel structure 2 of the enhancement-mode switching device is a multi-channel structure including k layers of channel layers and k layers of barrier layers alternately arranged, where k≥2. As the trench 3 penetrates through the plurality of channel structures, the switching device may be effectively turned off. The n-type semiconductor layer 8 covers a bottom wall and sidewalls of the trench 3, that is, the sidewalls are covered by the plurality of channel structures, and the n-type semiconductor layer 8 of the present disclosure is used to connect the plurality of channel structures. The p-type semiconductor layer 4 is arranged on the n-type semiconductor layer 8 for gate electrode control. A control ability of the gate electrode of multi-channel switching device of the present disclosure is further enhancement-mode, square resistance of the material is smaller and linearity under a radio frequency condition is better.

Figure 9:
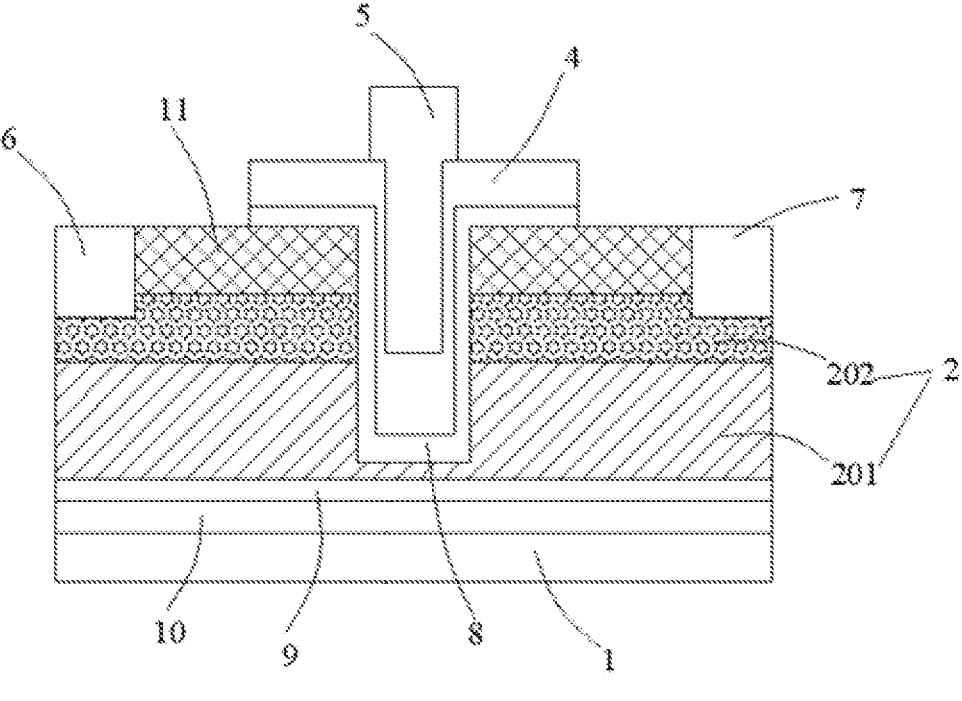
FIG. 9 is a schematic diagram of an enhancement-mode switching device according to an embodiment of the present disclosure.

FIG. 9 is a schematic diagram of an enhancement-mode switching device according to an embodiment of the present disclosure. The preparation method of the enhancement-mode switching device and the enhancement-mode switching device shown in FIG. 9 is roughly the same as the enhancement-mode switching device of any embodiment shown in FIG. 1, FIG. 4, FIG. 5, FIG. 6, FIG. 7 and FIG. 8 and the preparation method of the enhancement-mode switching device described above. A difference is that a p-type semiconductor layer 4 is shape-maintained and arranged in a trench 3 and the trench 3 is not completely filled up.

Figure 10:
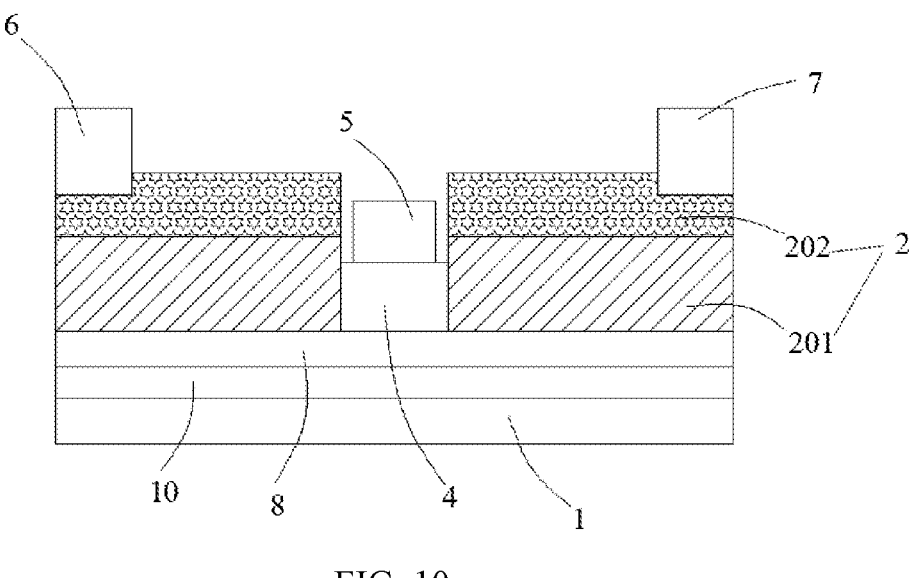
FIG. 10 is a schematic diagram of an enhancement-mode switching device according to an embodiment of the present disclosure.

FIG. 10 is a schematic diagram of an enhancement-mode switching device according to an embodiment of the present disclosure. As shown in FIG. 10, an enhancement-mode switching device according to the present disclosure includes a substrate 1, a channel structure 2, a source electrode 6, a drain electrode 7 and a gate electrode 5; where a trench 3 penetrates through the channel structure 2. The enhancement-mode switching device shown in FIG. 10 and the preparation method of the enhancement-mode switching device are substantially the same as the enhancement-mode switching device shown in FIG. 1 and the preparation method of the enhancement-mode switching device described above. A difference is that the enhancement-mode switching device further includes an n-type semiconductor layer 8 arranged on a surface, facing toward the substrate 1, of a channel layer 201; and a p-type semiconductor layer 4 formed on the n-type semiconductor layer 8 exposed by the trench 3. A material of the n-type semiconductor layer 8 includes one or more of n-type GaN, n-type AlGaN and n-type InGaN. When the material of the n-type semiconductor layer 8 is n-type doped AlGaN, the n-type semiconductor layer 8 may work as an etching stop layer. It should be noted that the n-type semiconductor layer 8 may be formed by epitaxial growth before formation of the channel structure 2. According to the enhancement-mode switching device of the present disclosure, the n-type semiconductor layer 8 is arranged below the channel layer 201. On the one hand, a PN junction is formed between the n-type semiconductor layer 8 and the p-type semiconductor layer 4 arranged on the n-type semiconductor layer 8, which enables that the switching device may be effectively turned off; on the other hand, the n-type semiconductor layer 8 may be used as the etching stop layer when the trench is etched, further simplifying a manufacturing process of the switching device.

Figure 11:
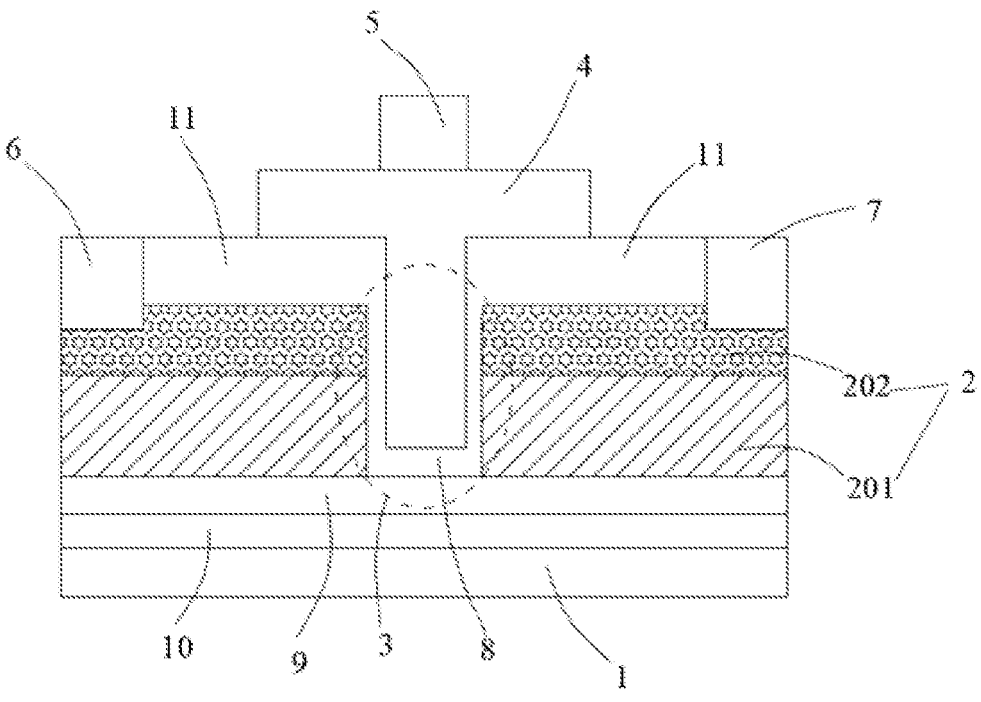
FIG. 11 is a schematic diagram of an enhancement-mode switching device according to an embodiment of the present disclosure.

FIG. 11 is a schematic diagram of an enhancement-mode switching device according to an embodiment of the present disclosure. The preparation method of the enhancement-mode switching device and the enhancement-mode switching device shown in FIG. 11 is roughly the same as the preparation of the enhancement-mode switching device and the enhancement-mode switching device of any embodiment shown in FIG. 1, FIG. 4, FIG. 5, FIG. 6, FIG. 7 and FIG. 8. A difference is that the enhancement-mode switching device further includes a cap layer 11. The cap layer 11 may be arranged on a side, away from the substrate 1, of the barrier layer 202, and an opening communicating with the trench 3 is provided. The cap layer 11 may be integrally formed with the n-type semiconductor layer 8, that is, the cap layer 11 and the n-type semiconductor layer 8 may be formed simultaneously through a one-step process. In addition, a doping concentration of n-type ions in the cap layer 11 is lower than that in the n-type semiconductor layer 8.

Figure 12:
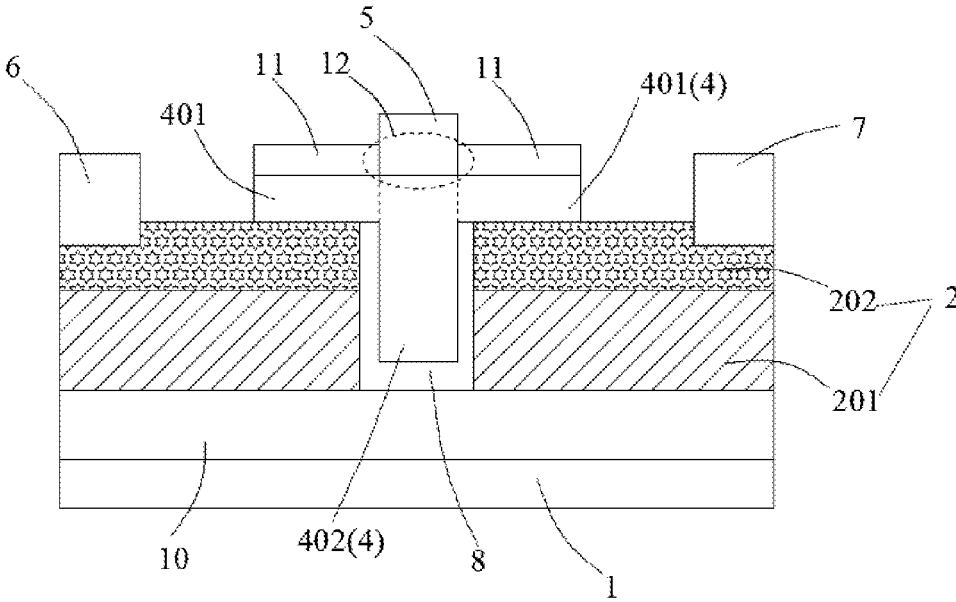
FIG. 12 is a schematic diagram of an enhancement-mode switching device according to an embodiment of the present disclosure.

FIG. 12 is a schematic diagram of an enhancement-mode switching device according to an embodiment of the present disclosure. The enhancement-mode switching device shown in FIG. 12 and the preparation method of the enhancement-mode switching device are roughly the same as the enhancement-mode switching device and the preparation method of the enhancement-mode switching device of any embodiment shown in FIG. 1, FIG. 4, FIG. 5, FIG. 6 and FIG. 7. A difference is that the enhancement-mode switching device further includes a cap layer 11 arranged on a side, way from the substrate 1, of the p-type semiconductor layer 4, and a through hole 12 arranged in the cap layer corresponding to the trench 3. The p-type semiconductor layer 4 includes a first part 401 and a second part 402, the second part 402 is a area of the p-type semiconductor layer 4 corresponding to the through hole 12, and the first part 401 is other areas of the p-type semiconductor layer 4. The second part 402 is in an activated state, and the first part 401 is in a passivated state.

The above description is only a preferred embodiment of the present disclosure, and does not limit the present disclosure in any form. Although the present disclosure has been disclosed as above with a preferred embodiment, it is not intended to limit the present disclosure. Anyone personnel familiar with this professional technology without departing from the scope of the technical solution of the present disclosure, when using the technical content disclosed above to make some changes or modifications shall be regarded as equivalent implementations with equivalent changes. All the content that does not depart from the technical solution of the present disclosure, according to this technical essence of the disclosure, any simple modifications, equivalent changes and modifications made to the above embodiments still fall within the scope of the technical solutions of the present disclosure.

What is claimed is:

1. An enhancement-mode switching device, comprising:
   a substrate;
   a channel structure comprising a channel layer and a barrier layer, wherein the channel layer is arranged on the substrate, and the barrier layer is arranged on a side, away from the substrate, of the channel layer; a trench is provided on a side, away from the substrate, of the channel structure, and the trench penetrates through the channel structure along a thickness direction of the channel structure and reaches a bottom of the channel layer; the channel structure comprises a source region, a drain region, and a gate region located between the source region and the drain region; and the trench is arranged in the gate region;
   an n-type semiconductor layer covering a bottom wall of the trench;
   a p-type semiconductor layer, wherein the p-type semiconductor layer is arranged, in the gate region, on the n-type semiconductor layer, and at least a partial area of the p-type semiconductor layer is arranged in the trench; the p-type semiconductor layer comprises at least one composition changing element, a content of the composition changing element changes in an epitaxial direction, and a changing curve of the content of the composition changing element in the epitaxial direction comprises one or more changing stages and the changing stages comprise: periodic changing, progressive increasing and progressive decreasing;
   wherein the p-type semiconductor layer is a periodic structure, and the periodic structure comprises at least one period stacked sequentially in the epitaxial direction, each period comprises a first periodic layer and a second periodic layer stacked sequentially in the epitaxial direction;
   in the epitaxial direction, a content, in the first periodic layer, of the composition changing element increases at an uniform speed and a content, in the second periodic layer, of a composition changing element decreases at an uniform speed in the epitaxial direction; or
   in the epitaxial direction, the content, in the first periodic layer, of the composition changing element decreases at an uniform speed and the content, in the second periodic layer, of the composition changing element increases at an uniform speed; or
   in the epitaxial direction, a first content, in the first periodic layer, of the composition change element is constant, and a second content, in the second periodic layer, of the composition change element is constant, the first content is higher than the second content, or the first content is lower than the second content; or
   in the epitaxial direction, the content, in the first periodic layer, of the composition changing element increases at an uniform speed, and the content, in the second periodic, of the composition changing element is constant; or
   in the epitaxial direction, the content, in the first periodic layer, of the composition changing element decreases at an uniform speed, and the content, in the second periodic layer, of the composition changing element is constant;
   a gate electrode arranged on a side, away from the substrate, of the p-type semiconductor layer;
   a source electrode arranged in the source region; and
   a drain electrode arranged in the drain region.

2. The enhancement-mode switching device according to claim 1, wherein the n-type semiconductor layer covers the bottom wall and sidewalls of the trench, and the p-type semiconductor layer is arranged on the n-type semiconductor layer.

3. The enhancement-mode switching device according to claim 2, wherein the channel structure is a multi-channel structure comprising k layers of the channel layers and k layers of the barrier layers alternately arranged, wherein k≥2.

4. The enhancement-mode switching device according to claim 1, wherein a material of the n-type semiconductor layer comprises one or more of n-type GaN, n-type AlGaN and n-type InGaN.

5. The enhancement-mode switching device according to claim 1, wherein a doping concentration of p-type impurity ions in the p-type semiconductor layer changes, from bottom to top, in one or more modes and the modes comprise:
   gradually increasing, gradually decreasing, step-type increasing, step-type decreasing and periodic changing.

6. The enhancement-mode switching device according to claim 1, wherein a material of the p-type semiconductor layer comprises one or more of p-type GaN, p-type AlGaN and p-type InGaN.

7. The enhancement-mode switching device according to claim 1, wherein the trench comprises a plurality of discrete trenches.

8. The enhancement-mode switching device according to claim 1, further comprising:
   a back barrier layer, arranged on a side, facing toward the substrate, of the channel layer.

9. The enhancement-mode switching device according to claim 8, wherein the back barrier layer is an n-type semiconductor layer.

10. The enhancement-mode switching device according to claim 1, further comprising a cap layer arranged on a side, away from the substrate, of the barrier layer, and the cap layer being provided with an opening communicating with the trench.

11. The enhancement-mode switching device according to claim 1, further comprising an N-type heavily doped nitride semiconductor arranged in the source region and the drain region.

12. An enhancement-mode switching device, comprising:
   a substrate;
   a channel structure comprising a channel layer and a barrier layer, wherein the channel layer is arranged on the substrate, and the barrier layer is arranged on a side, away from the substrate, of the channel layer; a trench is provided on a side, away from the substrate, of the channel structure, and the trench penetrates through the channel structure along a thickness direction of the channel structure and reaches a bottom of the channel layer; the channel structure comprises a source region, a drain region, and a gate region located between the source region and the drain region; and the trench is arranged in the gate region;
   an n-type semiconductor layer arranged on a surface, facing toward the substrate, of the channel layer, wherein a p-type semiconductor layer is formed on the n-type semiconductor layer exposed by the trench; the p-type semiconductor layer comprises at least one composition changing element, a content of the composition changing element changes in an epitaxial direction, and a changing curve of the content of the composition changing element in the epitaxial direction comprises one or more changing stages and the changing stages comprise: periodic changing, progressive increasing and progressive decreasing;
   wherein the p-type semiconductor layer is a periodic structure, and the periodic structure comprises at least one period stacked sequentially in the epitaxial direction, each period comprises a first periodic layer and a second periodic layer stacked sequentially in the epitaxial direction;
   in the epitaxial direction, a content, in the first periodic layer, of the composition changing element increases at an uniform speed and a content, in the second periodic layer, of a composition changing element decreases at an uniform speed in the epitaxial direction; or
   in the epitaxial direction, the content, in the first periodic layer, of the composition changing element decreases at an uniform speed and the content, in the second periodic layer, of the composition changing element increases at an uniform speed; or
   in the epitaxial direction, a first content, in the first periodic layer, of the composition change element is constant, and a second content, in the second periodic layer, of the composition change element is constant, the first content is higher than the second content, or the first content is lower than the second content; or
   in the epitaxial direction, the content, in the first periodic layer, of the composition changing element increases at an uniform speed, and the content, in the second periodic, of the composition changing element is constant; or
   in the epitaxial direction, the content, in the first periodic layer, of the composition changing element decreases at an uniform speed, and the content, in the second periodic layer, of the composition changing element is constant;
   a gate electrode, arranged on a side, away from the substrate, of the p-type semiconductor layer;
   a source electrode, arranged in the source region; and
   a drain electrode, arranged in the drain region.

13. A preparation method for an enhancement-mode switching device, comprising:
   providing a substrate;
   forming a channel structure, wherein the channel structure comprises a channel layer and a barrier layer, the channel layer is arranged on the substrate, and the barrier layer is arranged on a side, away from the substrate, of the channel layer; the channel structure comprises a source region, a drain region, and a gate region located between the source region and the drain region; and the trench is arranged in the gate region;
   arranging a trench on a side, away from the substrate, of the channel structure, wherein the trench penetrates through the channel structure along a thickness direction of the channel structure and reaches a bottom of the channel layer, and the trench is arranged in the gate region;
   forming an n-type semiconductor layer covering a bottom wall of the trench;
   forming a p-type semiconductor layer on the n-type semiconductor layer, wherein at least a partial area of the p-type semiconductor layer is arranged in the trench; the p-type semiconductor layer comprises at least one composition changing element, a content of the composition changing element changes in an epitaxial direction, and a changing curve of the content of the composition changing element in the epitaxial direction comprises one or more changing stages and the changing stages comprise: periodic changing, progressive increasing and progressive decreasing;
   wherein the p-type semiconductor layer is a periodic structure, and the periodic structure comprises at least one period stacked sequentially in the epitaxial direction, each period comprises a first periodic layer and a second periodic layer stacked sequentially in the epitaxial direction;
   in the epitaxial direction, a content, in the first periodic layer, of the composition changing element increases at an uniform speed and a content, in the second periodic layer, of a composition changing element decreases at an uniform speed in the epitaxial direction; or
   in the epitaxial direction, the content, in the first periodic layer, of the composition changing element decreases at an uniform speed and the content, in the second periodic layer, of the composition changing element increases at an uniform speed; or
   in the epitaxial direction, a first content, in the first periodic layer, of the composition change element is constant, and a second content, in the second periodic layer, of the composition change element is constant, the first content is higher than the second content, or the first content is lower than the second content; or
   in the epitaxial direction, the content, in the first periodic layer, of the composition changing element increases at an uniform speed, and the content, in the second periodic, of the composition changing element is constant; or in the epitaxial direction, the content, in the first periodic layer, of the composition changing element decreases at an uniform speed, and the content, in the second periodic layer, of the composition changing element is constant;

forming a gate electrode on a side, away from the substrate, of the p-type semiconductor layer;

forming a source electrode in the source region; and forming a drain electrode in the drain region.

14. The preparation method for the enhancement-mode switching device according to claim 13, wherein the forming an n-type semiconductor layer covering a bottom wall of the trench comprises:

forming the n-type semiconductor layer covering the bottom wall and sidewalls of the trench.

15. The preparation method for the enhancement-mode switching device according to claim 14, wherein the forming a channel structure comprises:

forming a multi-channel structure comprising k layers of channel layers and k layers of barrier layers alternately arranged, wherein $k \geq 2$.

16. The preparation method for the enhancement-mode switching device according to claim 13, further comprising:

forming a back barrier layer on a side, facing toward the substrate, of the channel layer.

*     *     *     *     *